United States Patent [19]

Rountree et al.

[11] Patent Number: 4,692,781
[45] Date of Patent: Sep. 8, 1987

[54] SEMICONDUCTOR DEVICE WITH ELECTROSTATIC DISCHARGE PROTECTION

[75] Inventors: Robert N. Rountree, Richmond; Troy H. Herndon, Houston, both of Tex.

[73] Assignee: Texas Instruments Incorporated, Dallas, Tex.

[21] Appl. No.: 617,876

[22] Filed: Jun. 6, 1984

[51] Int. Cl.[4] ............... H01L 27/04; H01L 29/78
[52] U.S. Cl. .................. 357/23.13; 357/41; 357/68
[58] Field of Search ............ 357/23.11, 23.13, 84, 357/53, 41, 65, 68; 361/1, 56, 91

[56] References Cited

U.S. PATENT DOCUMENTS

| | | | |
|---|---|---|---|
| 3,673,427 | 6/1972 | McCoy et al. | 357/23.13 |
| 3,999,213 | 12/1976 | Brandt et al. | 357/53 |
| 4,055,444 | 10/1977 | Rao | 357/51 |
| 4,288,829 | 9/1981 | Tango | 357/23.13 |
| 4,342,045 | 7/1982 | Kim | 357/41 |
| 4,509,067 | 4/1985 | Minami et al. | 357/23.13 |
| 4,514,646 | 4/1985 | Ando et al. | 357/23.13 |

FOREIGN PATENT DOCUMENTS

| | | | |
|---|---|---|---|
| 0136278 | 10/1978 | Japan | 357/23.13 |
| 0013780 | 2/1979 | Japan | 357/53 |
| 0037584 | 3/1979 | Japan | 357/53 |
| 0061657 | 4/1983 | Japan | 357/23.13 |

Primary Examiner—James W. Davie
Attorney, Agent, or Firm—John G. Graham

[57] ABSTRACT

An input protection circuit for an MOS device uses a thick-oxide transistor connected as a diode between a metal bonding pad and ground. The channel width of this transistor is chosen to be sufficient to withstand large, short-duration current spikes caused by electrostatic discharge. More important, the spacing between a metal-to-silicon contact to the drain of this transistor and the channel of the transistor (where heat is generated), is chosen to be much larger than usual so the metal of the contact will not be melted by heat propagating along the silicon surface during the current spike due to ESD. This spacing feature also applies to circuits for output pads, or circuits using diode protection devices.

10 Claims, 6 Drawing Figures

SEMICONDUCTOR DEVICE WITH ELECTROSTATIC DISCHARGE PROTECTION

BACKGROUND OF THE INVENTION

This invention relates to semiconductor devices, and more particularly to electrostatic discharge protection circuits for input and output terminals of such devices.

All MOS devices employ protection circuits at the input and output pads to prevent damage to the internal circuitry caused by electrostatic discharge. Usually the voltage level which these protection circuits will withstand is about 3000 volts. An MOS device can be damaged by routine handling, even with this degree of protection.

It is the principal object of this invention to provide improved electrostatic discharge protection for MOS integrated circuits. Another object is to provide input and output protection circuits for MOS device that can withstand much more than 3000 volts ESD, preferably up to 8000 to 10000 volts.

SUMMARY OF THE INVENTION

In accordance with one embodiment of the invention, an input protection circuit for an MOS device uses a thick-oxide transistor connected between a metal bonding pad and ground. The channel width of this transistor is chosen to be sufficient to withstand large, short-duration current spikes caused by electrostatic discharge. More important, the spacing between a metal-to-silicon contact to the drain of this transistor and the channel of the transistor (where most of the heat is generated), is chosen to be much larger than usual so the metal of the contact will not be melted by heat propagating along the silicon surface during the current spike due to ESD. This spacing feature also applies to circuits for output pads, or circuits using diode protection devices.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
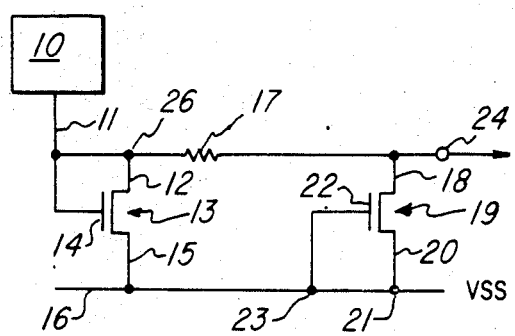
FIG. 1 is an electrical schematic diagram of an input protection circuit according to the invention.
Figure 2:
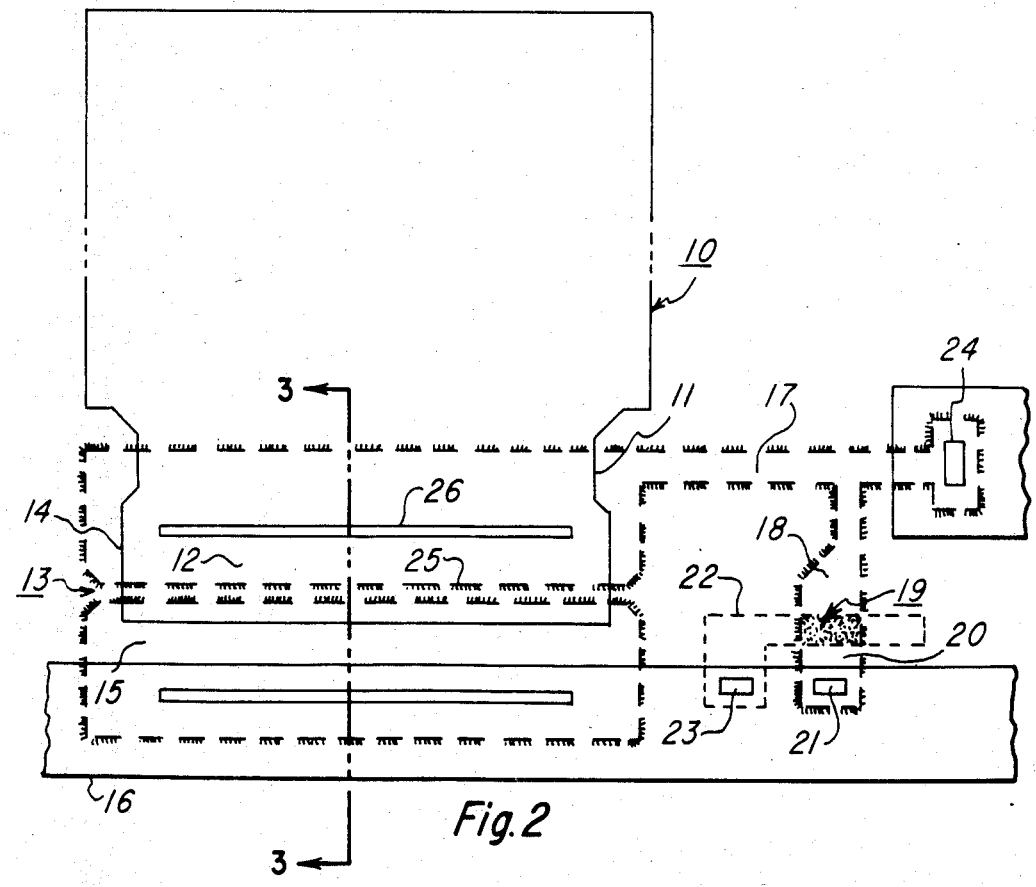
FIG. 2 is a plan view, greatly enlarged, of a part of a semiconductor chip having the circuit of FIG. 1.
Figure 3:
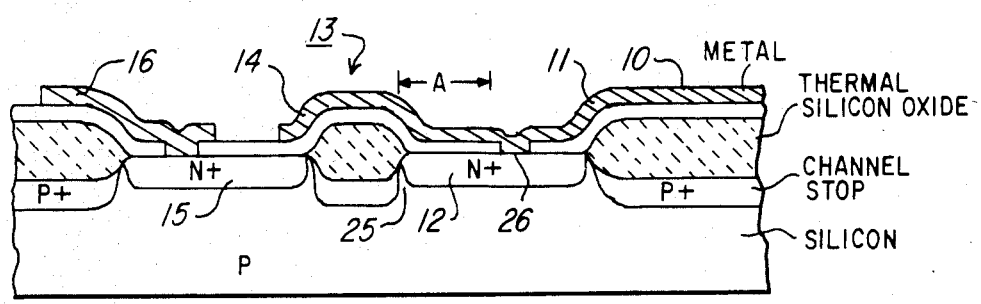
FIG. 3 is an elevation view in section of the device of FIG. 2, taken along the line 3—3 in FIG. 2.

Referring to FIGS. 1, 2 and 3, an input circuit for an MOS device has a metal bonding pad 10 which is connected by a metal conductor 11 to the drain 12 of transistor 13. This transistor has its gate 14 shorted to its drain and has its source 15 connected to a Vss line 16. When the pad 10 is positive with respect to Vss, transistor 13 enters a low impedance state caused by secondary breakdown and conducts heavily to Vss, if pad 10 is positive with respect to Vss at a voltage level which exceeds the thick-oxide threshold voltage Vt level of about +20 or +25 v with respect to Vss. When the pad 10 is negative with respect to Vss, the N+ drain region 12 acts as a forward-biased diode and conducts heavily to Vss. The drain node 12 of transistor 13 is also connected to one end of elongated N+ path 17 which functions as a resistor, and the other end of the resistor is connected to the drain 18 of an MOS transistor 19 which functions as a "field plate diode". The source 20 of this transistor 19 is connected to the Vss line 16 at a metal to silicon contact 21, and the gate 22 (in this case polysilicon) is also connected to the Vss line 16 at a contact 23. Together, the diffused resistor 17 and the field plate diode or traansistor 19 act as an isolation stage between the pad 10 and the internal circuitry of the chip. The node 18 is connected to the internal circuitry of the chip (such as an address buffer, etc.) at a metal-to-silicon contact 24. The transistor 19 has the usual thin gate oxide beneath the poly gate 22, whereas the transistor 13 has a thick field oxide beneath its gate 14.

It has been found that a vital feature of the protection circuit of FIGS. 1, 2 and 3 is the channel width W of the transistor 13, and the spacing A between the channel edge 25 and the metal-to-silicon contact 26 connecting the drain 12 to the connector 11. The reason for criticality of this spacing A is due to the heat generated in the channel area of transistor 13, and the fact that this heat travels along the surface of the silicon from the edge 25 to the metal contact 26, melts the aluminum of this contact, which in turn penetrates the silicon by alloying, and shorts the junction. Since silicon is a good heat conductor compared to silicon oxide, the path is along the surface to the contact rather than vertically to the metal above the junction.

The input protection circuit of FIGS. 1, 2 and 3 is designed to withstand electrostatic voltage build-up of, for example, seven or eight thousand volts on the pad 10. An electrostatic voltage is discharged by a very rapid current spike with very high peak current but short duration. Ordinarily, MOS devices will withstand only about 3000 volts. Voltages of this magnitude are easily generated by friction in routine handling, so special precautions have been needed to keep all of the terminals grounded or shorted together to avoid damage due to these electrostatic voltages.

In accordance with the invention, the channel width W of the transistor 13 is at least about five or six mils so that it can conduct a large instantaneous current spike with low forward drop. The channel length is about 3 microns, but this is not critical; usually the channel length is the same as the standard channel length for most transistors for the design rules used for the particular chip design. The distance A is more critical. This is selected to be at least about six or seven microns, preferably eight or ten, whereas for 3-micron design rules the spacing would ordinarily be about three microns. Thus, the spacing A is about two or three times what would usually be expected. This spacing A, according to the invention, increases the electrostatic discharge protection from about 3000 v to at least double that level, or triple. It has been found that a monotonically increasing relationship exists for spacing A, and a linear relationship exists for width W, vs. the allowable ESD level, up to about 9 or 10000 v, at which point another failure mechanism takes over.

The device of FIGS. 1, 2 and 3 is constructed by the standard N-channel silicon gate MOS process such as that disclosed in U.S. Pat. No. 4,055,444, issued to G. R. Mohan Rao, assigned to Texas Instruments.

Figure 4:
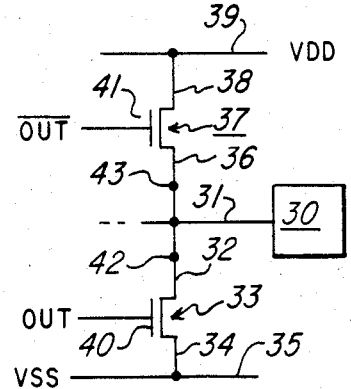
FIG. 4 is an electrical schematic diagram of an output circuit according to another embodiment of the invention.
Figure 5:
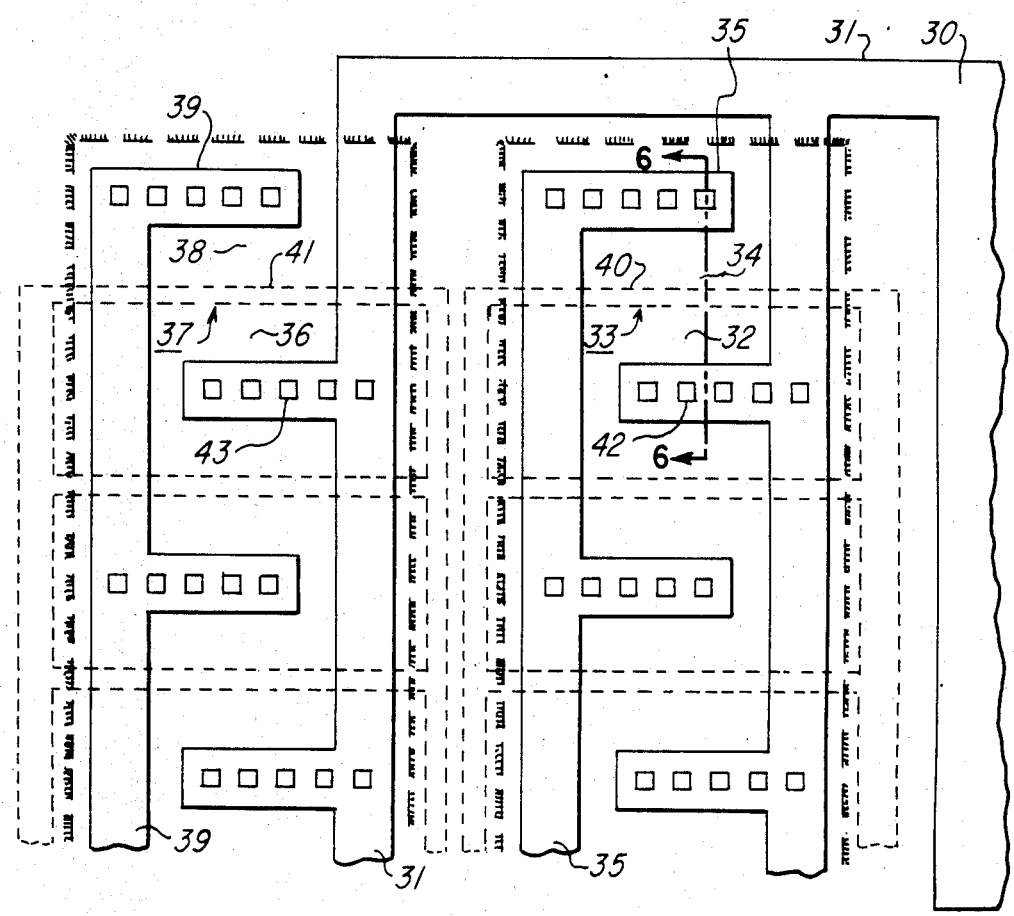
FIG. 5 is a plan view, greatly enlarged, of a part of a semiconductor chip having the circuit of FIG. 4.
Figure 6:
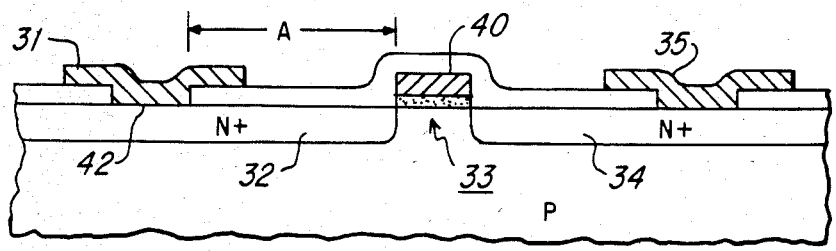
FIG. 6 is an elevation view in section of the device of FIG. 5, taken along the line 6—6 in FIG. 5.

Referring to FIGS. 4, 5 and 6, the concept of the invention can be applied as well to output terminals. An output bonding pad 30 is connected by a metal line 31 to the drain 32 of a transistor 33 which has its source 34 connected to Vss line 35. On the high side the metal line 31 is connected to the source 36 of a transistor 37 which has its drain 38 connected to a Vdd line 39. The gates 40 and 41 of these two transistors 33 and 37 are driven by complementary signals, providing a push-pull output. These two transistors are ordinarily of interdigitated structure to provide uniform current density at high current capacities. Only one small part of the transistor structure is shown in FIGS. 5 and 6. The effective channel width W of each of the transistors 33 and 37 is over 400 microns (broken into segments), for example, and so these can withstand a substantial current spike caused by ESD. However, the problem of melted aluminum at contact areas 42 and 43 would still exist. For this reason, the spacing A is greater than what would ordinarily be expected, as discussed above, so that the heat generated in the channel beneath the gate 40 or 41 does not reach the aluminum contact within the time the current spike subsists.

A CMOS circuit can also use the features of the invention. Usually an input protection circuit for CMOS devices employs a pair of diodes instead of the thick oxide transistor 13, one diode going to Vss and the other to Vdd. The heat-generating part of a diode is depletion region of the junction, as in a transistor. Thus, the critical spacing is the distance between the metal-to-silicon contact engaging one electrode of the diode, and the junction of the diode. To provide a high level of ESD protection, this spacing should be about two or three times the "design rule" spacing. Preferably, this spacing should be five or six microns or more to achieve in excess of 7000 or 8000 volts ESD immunity.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. An input protection structure for an MOS device, comprising:
    (a) a metal input pad on a face of a silicon chip,
    (b) a transistor having a thick gate oxide, having a source-to-drain path connecting said metal input pad to a voltage-supply conductor, having a metal gate, and having a drain region directly connected to said metal gate and metal input pad at an elongated contact area parallel to the width of said source-to-drain path,
    (c) wherein the width of said source-to-drain path is at least about 25 times the length of the source-to-drain path, and wherein the spacing along said face between said source-to-drain path and said elongated contact area is at least about twice said length of the source-to-drain path.

2. A structure according to claim 1 wherein said metal gate is an extended area of said metal input pad.

3. A structure according to claim 2 wherein said transistor has a source region in said face, said voltage supply conductor is a metal line running along said face and ordinarily connected to ground, and a metal-to-silicon contact area connects said metal line to said source region, said metal-to-silicon contact area also being spaced from said source-to-drain path by at least about twice said length of the source-to-drain path.

4. A protection structure for a semiconductor device, comprising:
    (a) a metal bonding pad at a face of a silicon chip,
    (b) a current path in said face of the silicon chip at the surface thereof, said current path being many times wider than its length;
    (c) means at said face including a metal-to-silicon contact area directly connected to said metal bonding pad without intervening resistor devices, said means coupling said current path in series between said metal bonding pad and a voltage supply terminal of said chip,
    (d) said contact area extending along the face parallel to the width dimension of said current path, for at least a substantial part of the width thereof, said contact area being spaced from said current path by an amount at least about twice the length of the current path.

5. A structure according to claim 4 wherein said current path is the channel of an MOS transistor.

6. A structure according to claim 5 wherein said metal contact is integral with a metal gate of said transistor extending over said channel.

7. A structure according to claim 6 wherein said metal contact is integral with said metal bonding pad.

8. A structure according to claim 5 wherein said channel is segmented and the transistor has interdigitated source and drain regions.

9. A structure according to claim 8 wherein said bonding pad is an output terminal.

10. A structure according to claim 4 wherein said current path is at a PN junction.

* * * * *

REEXAMINATION CERTIFICATE (2590th)
United States Patent [19]
Rountree et al.

[11] B1 4,692,781
[45] Certificate Issued May 30, 1995

[54] SEMICONDUCTOR DEVICE WITH ELECTROSTATIC DISCHARGE PROTECTION

[75] Inventors: Robert N. Rountree, Richmond; Troy H. Herndon, Houston, both of Tex.

[73] Assignee: Texas Instruments Incorporated, Dallas, Tex.

Reexamination Request:
No. 90/003,474, Jun. 24, 1994

Reexamination Certificate for:
Patent No.: 4,692,781
Issued: Sep. 8, 1987
Appl. No.: 617,876
Filed: Jun. 6, 1984

[51] Int. Cl.⁶ .................. H01L 27/04; H01L 29/78
[52] U.S. Cl. ................................................. 257/360
[58] Field of Search .......................................... 257/360

[56] References Cited

U.S. PATENT DOCUMENTS

| | | | |
|---|---|---|---|
| 3,673,427 | 6/1972 | McCoy et al. | 357/23.13 |
| 3,999,213 | 12/1976 | Brandt et al. | 357/53 |
| 4,055,444 | 10/1977 | Rao | 357/51 |
| 4,288,829 | 9/1981 | Tango | 357/23.13 |
| 4,342,045 | 7/1982 | Kim | 357/41 |
| 4,509,067 | 4/1985 | Minami et al. | 357/23.13 |
| 4,514,646 | 4/1985 | Ando et al. | 357/23.13 |
| 4,786,956 | 11/1988 | Puar | 357/23.13 |

OTHER PUBLICATIONS

Domingos, Henry, "Electro–Thermal Overstress Failure in Microelectronics", *RADC-TR-73-87*, Apr. 1973.
De La Moneda et al., "Layout for Lateral NPN Protective Device Enhancing Chip Wireability", *IBM Technical Disclosure Bulletin*, 3427, vol. 24, No. 7A, Dec. 1981.
Hulett, T. V., "On Chip Protection of High Density NMOS Devices", *EOS/ESD Symp. Proc.*, 90, 1981 (No month).
DeChairo, L. F., "Electro–Thermomigration in NMOS LSI Devices", *19th Annual Proc. Reliability Physics*, 223, 1981 (no month).
Goel, A., "Procedure for Testing Electrostatic Discharge Susceptibility of MOS Devices", *19th Annual Proc. Reliability Physics*, 200, 1981 (no month).
Greason et al., "Analysis of ESD Damage in JFET Preamplifiers", *EOS/ESD Symp. Proc.*, 67, 1980 (no month).
Taylor R. "Input Protection Design for the 3μ NMOS Process", *EOS/ESD Symp. Proc.*, 97, 1980 (no month).
Turner et al., "Electrostatic Sensitivity of Various Input Protection Networks", *EOS/ESD Symp. Proc.*, 95, 1980 (no month).
Hart et al., "LSI Design Considerations for ESD Protection Structures Related to Process and Layout Variations", *EOS/ESD Symp. Proc.*, 87, 1980 (no month).
Carlson et al., "Electrostatic Discharge Protective Device for Bipolar Circuits", *IBM Technical Disclosure Bulletin*, 179, (vol. 21, No. 1), May 1978.
van Beek, H. W., "MOS/LSI Circuit Design: Designing-In Reliability", *10th Annual Proc. Reliability Physics*, 36, 1972, (no month).

*Primary Examiner*—James W. Davie

[57] ABSTRACT

An input protection circuit for an MOS device uses a thick-oxide transistor connected as a diode between a metal bonding pad and ground. The channel width of this transistor is chosen to be sufficient to withstand large, short-duration current spikes caused by electrostatic discharge. More important, the spacing between a metal-to-silicon contact to the drain of this transistor and the channel of the transistor (where heat is generated), is chosen to be much larger than usual so the metal of the contact will not be melted by heat propagating along the silicon surface during the current spike due to ESD. This spacing feature also applies to circuits for output pads, or circuits using diode protection devices.

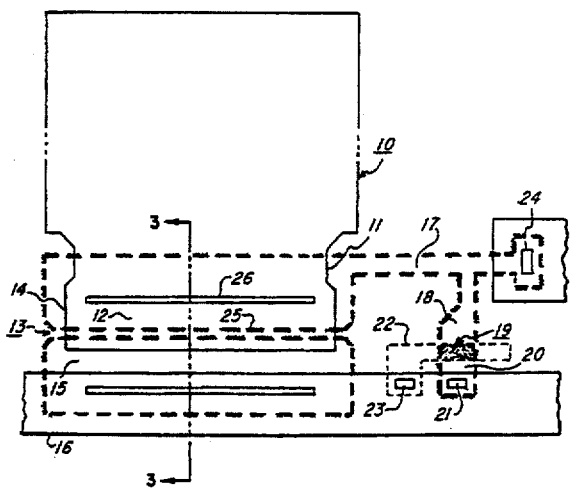

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-3 is confirmed.

Claim 10 is cancelled.

Claim 4 is determined to be patentable as amended.

Claims 5-9, dependent on an amended claim, are determined to be patentable.

New claims 11-112 are added and determined to be patetnable.

4. A protection structure for a semiconductor device, comprising:
(a) a metal bonding pad at a face of a silicon chip [,]  ;
(b) a first N type diffused region in said face of the silicon chip at the surface thereof;
(c) a second N type diffused region in said face of the silicon chip at the surface thereof, said second N type diffused region being spaced apart from said first N type diffused region;
([b] d) a current path *formed between said first N type diffused region and said second N type diffused region* in said face of the silicon chip at the surface thereof, *for coupling said first N type diffused region to said second N type diffused region,* said current path being many times wider than its length;
([c] e) [means at said face including] *a first* metal-to-silicon contact area directly connected to said metal bonding pad without intervening resistor devices *between said first metal-to-silicon contact area and said metal bonding pad,* [said means] *for* coupling said [current path in series between said ] metal bonding pad [and a voltage supply terminal of said chip] *to said first N type diffused region,*
([d] f) said *first metal-to-silicon* contact area extending along the face parallel to the width dimension of said current path, for at least a substantial part of the width thereof, said *first metal-to-silicon* contact area being spaced from said current path by an amount at least [about] twice the length of the current path [.]; *and*
(g) *a second metal-to-silicon contact area connected to a voltage supply terminal of said chip, for coupling said voltage supply terminal to said second N type diffused region, said second metal-to-silicon contact area extending along the face parallel to the width dimension of said current path for at least a substantial part of the width thereof.*

*11. An input protection structure for an MOS device, comprising:*
*(a) a metal input pad on a face of a silicon chip,*
*(b) a transistor having a thick gate oxide, having a source-to-drain path connecting said metal input pad to a voltage-supply conductor, having a metal gate, and having a drain region directly connected to said metal gate and metal input pad at an elongated contact area parallel to the width of said source-to-drain path,*
*(c) wherein the width of said source-to-drain path is at least about 25 times the length of the source-to-drain path, and wherein the spacing along said face between said source-to-drain path and said elongated contact area is at least twice said length of the source-to-drain path.*

*12. An input protection structure as in claim 11 wherein said elongated contact area comprises a plurality of metal-to-silicon contacts and the area therebetween.*

*13. A protection structure for a semiconductor device, comprising:*
*(a) a metal bonding pad at a face of a silicon chip;*
*(b) a first N type diffused region in said face of the silicon chip at the surface thereof;*
*(c) a second N type diffused region in said face of the silicon chip at the surface thereof, said second N type diffused region being spaced apart from said first N type diffused region;*
*(d) a current path formed between said first N type diffused region and said second N type diffused region in said face of the silicon chip at the surface thereof, for coupling said first N type diffused region to said second N type diffused region, said current path being many times wider than its length;*
*(e) a first metal-to-silicon contact area directly connected to said metal bonding pad without intervening resistor devices between said first metal-to-silicon contact area and said metal bonding pad, for coupling said metal bonding pad to said first N type diffused region,*
*(f) said first metal-to-silicon contact area extending along the face parallel to the width dimension of said current path, for at least a substantial part of the width thereof, said first metal-to-silicon contact area being spaced from said current path by an amount at least twice the length of the current path; and*
*(g) a second metal-to-silicon contact area connected to a voltage supply terminal of said chip, for coupling said voltage supply terminal to said second N type diffused region, said second metal-to-silicon contact area extending along the face parallel to the width dimension of said current path for at least a substantial part of the width thereof.*

*14. A protection structure as in claim 13 wherein said current path is a channel region of an MOS transistor.*

*15. A protection structure as in claim 14 wherein said first and second metal-to-silicon contact areas each comprise a plurality of metal-to-silicon contacts and the area therebetween.*

*16. A protection structure as in claim 15 wherein said channel region is segmented and said first and second N type diffused regions are interdigitated drain and source regions.*

*17. A protection structure as in claim 16 wherein said substantial part is at least one half.*

*18. A protection structure as in claim 17 wherein said many times is at least 25.*

*19. A protection structure as in claim 13 wherein said current path is a channel region of a thick oxide transistor.*

20. A protection structure as in claim 19 wherein said first and second metal-to-silicon contact areas each comprise a plurality of metal-to-silicon contacts and the area therebetween.

21. A protection structure as in claim 20 wherein said substantial part is at least one half.

22. A protection structure as in claim 21 wherein said many times is at least 25.

23. A protection structure as in claim 13 wherein said current path is a P type region of an NPN transistor.

24. A protection structure as in claim 23 wherein said first and second metal-to-silicon contact areas each comprise a plurality of metal-to-silicon contacts and the area therebetween.

25. A protection structure as in claim 24 wherein said substantial part is at least one half.

26. A protection structure as in claim 25 wherein said many times is at least 25.

27. A structure for a semiconductor device, comprising:
(a) a metal bonding pad at a face of a silicon chip;
(b) a first N type diffused region in said face of the silicon chip at the surface thereof;
(c) a second N type diffused region in said face of the silicon chip at the surface thereof, said second N type diffused region being spaced apart from said first N type diffused region;
(d) a current path formed between said first N type diffused region and said second N type diffused region in said face of the silicon chip at the surface thereof, for coupling said first N type diffused region to said second N type diffused region, said current path being many times wider than its length;
(e) a first metal-to-silicon contact area directly connected to said metal bonding pad without intervening resistor devices between said first metal-to-silicon contact area and said metal bonding pad, for coupling said metal bonding pad to said first N type diffused region,
(f) said first metal-to-silicon contact area extending along the face parallel to the width dimension of said current path, for at least a substantial part of the width thereof, said first metal-to-silicon contact area being spaced from said current path by an amount at least twice the length of the current path; and
(g) a second metal-to-silicon contact area connected to a voltage supply terminal of said chip, for coupling said voltage supply terminal to said second N type diffused region, said second metal-to-silicon contact area extending along the face parallel to the width dimension of said current path for at least a substantial part of the width thereof.

28. A structure as in claim 27 wherein said current path is a channel region of an MOS transistor.

29. A structure as in claim 28 wherein said first and second metal-to-silicon contact areas each comprise a plurality of metal-to-silicon contacts and the area therebetween.

30. A protection structure as in claim 29 wherein said channel region is segmented and said first and second N type diffused regions are interdigitated drain and source regions.

31. A structure as in claim 30 wherein said substantial part is at least one half.

32. A structure as in claim 31 wherein said many times is at least 25.

33. A structure as in claim 26 wherein said current path is a channel region of a thick oxide transistor.

34. A structure as in claim 33 wherein said first and second metal-to-silicon contact areas each comprise a plurality of metal-to-silicon contacts and the area therebetween.

35. A structure as in claim 34 wherein said substantial part is at least one half.

36. A structure as in claim 35 wherein said many times is at least 25.

37. A structure as in claim 27 wherein said current path is a P type region of an NPN transistor.

38. A structure as in claim 37 wherein said first and second metal-to-silicon contact areas each comprise a plurality of metal-to-silicon contacts and the area therebetween.

39. A structure as in claim 38 wherein said substantial part is at least one half.

40. A structure as in claim 39 wherein said many times is at least 25.

41. A structure for a semiconductor device, comprising:
(a) a metal bonding pad at a face of a silicon chip;
(b) a first N type diffused region in said face of the silicon chip at the surface thereof;
(c) a second N type diffused region in said face of the silicon chip at the surface thereof, said second N type diffused region being spaced apart from said first N type diffused region;
(d) a current path formed between said first N type diffused region and said second N type diffused region in said face of the silicon chip at the surface thereof, for coupling said first N type diffused region to said second N type diffused region, said current path being many times wider than its length;
(e) a first metal-to-silicon contact area directly connected to said metal bonding pad without intervening resistor devices between said first metal-to-silicon contact area and said metal bonding pad, for coupling said metal bonding pad to said first N type diffused region,
(f) said first metal-to-silicon contact area extending along the face parallel to the width dimension of said current path, for at least a substantial part of the width thereof, said first metal-to-silicon contact area being spaced from said current path by an amount at least about twice the length of the current path; and
(g) a second metal-to-silicon contact area connected to a voltage supply terminal of said chip, for coupling said voltage supply terminal to said second N type diffused region, said second metal-to-silicon contact area extending along the face parallel to the width dimension of said current path for at least a substantial part of the width thereof.

42. A structure as in claim 41 wherein said current path is a channel region of an MOS transistor.

43. A structure as in claim 42 wherein said first and second metal-to-silicon contact areas each comprise a plurality of metal-to-silicon contacts and the area therebetween.

44. A protection structure as in claim 43 wherein said channel region is segmented and said first and second N type diffused regions are interdigitated drain and source regions.

45. A structure as in claim 44 wherein said substantial part is at least one half.

46. A structure as in claim 45 wherein said many times is at least 25.

47. A structure as in claim 41 wherein said current path is a channel region of a thick oxide transistor.

48. A structure as in claim 47 wherein said first and second metal-to-silicon contact areas each comprise a plurality of metal-to-silicon contacts and the area therebetween.

49. A structure as in claim 48 wherein said substantial part is at least one half.

50. A structure as in claim 49 wherein said many times is at least 25.

51. A structure as in claim 41 wherein said current path is a P type region of an NPN transistor.

52. A structure as in claim 51 wherein said first and second metal-to-silicon contact areas each comprise a plurality of metal-to-silicon contacts and the area therebetween.

53. A structure as in claim 52 wherein said substantial part is at least one half.

54. A structure as in claim 53 wherein said many times is at least 25.

55. A protection structure for a semiconductor device, comprising:
(a) a metal bonding pad at a face of a silicon chip,
(b) a transistor having a source-to-drain path connecting said metal input pad to a voltage-supply conductor, having a metal gate, having an N type source region connected to said voltage-supply conductor, and having an N type drain region directly connected to said metal bonding pad at an elongated contact area parallel to the width of said source-to-drain path,
(c) wherein said source-to-drain path is many times wider than the length of said source-to-drain path, and wherein the spacing along said face between said source-to-drain path and said elongated contact area is at least about twice said length of said source-to-drain path.

56. A protection structure as in claim 55 wherein said elongated contact area comprises a plurality of metal-to-silicon contacts and the area therebetween.

57. A protection structure as in claim 56 wherein said source-to-drain path is segmented and said N type source and drain regions are interdigitated.

58. A protection structure as in claim 57 wherein said many times is at least 25.

59. A protection structure as in claim 58 wherein said transistor is a thick oxide transistor.

60. A protection structure for a semiconductor device, comprising:
(a) a metal bonding pad at a face of a silicon chip,
(b) a transistor having a source-to-drain path connecting said metal bonding pad to a voltage-supply conductor, having a polysilicon gate, having a source region connected to said voltage-supply conductor, and having a drain region directly connected to said metal bonding pad at an elongated contact area parallel to the width of said source-to-drain path.
(c) wherein said source-to-drain path is many times wider than the length of said source-to-drain path, and wherein the spacing along said face between said source-to-drain path and said elongated contact area is at least about twice said length of said source-to-drain path.

61. A protection structure as in claim 60 wherein said elongated contact area comprises a plurality of metal-to-silicon contacts and the area therebetween.

62. A protection structure as in claim 61 wherein said source-to-drain path is segmented and said source and drain regions are interdigitated.

63. A protection structures as in claim 62 wherein said many times is at least 25.

64. A protection structure as in claim 63 wherein said transistor is a thin oxide transistor.

65. A protection structure for a semiconductor device, comprising:
(a) a metal bonding pad at a face of a silicon chip;
(b) a first diffused region in said face of the silicon chip at the surface thereof;
(c) a second diffused region in said face of the silicon chip at the surface thereof, said second diffused region being spaced apart from said first diffused region;
(d) a current path, having no overlying gate, formed between said first diffused region and said second diffused region in said face of the silicon chip at the surface thereof, for coupling said first diffused region to said second diffused region, said current path being many times wider than its length;
(e) a first metal-to-silicon contact area directly connected to said metal bonding pad without intervening resistor devices between said first metal-to-silicon contact area and said metal bonding pad, for coupling said metal bonding pad to said first diffused region,
(f) said first metal-to-silicon contact area extending along the face parallel to the width dimension of said current path, for at least a substantial part of the width thereof, said first metal-to-silicon contact area being spaced from said current path by an amount at least about twice the length of the current path; and
(g) a second metal-to-silicon contact area connected to a voltage supply terminal of said chip, for coupling said voltage supply terminal to said second diffused region, said second metal-to-silicon contact area extending along the face parallel to the width dimension of said current path for at least a substantial part of the width thereof.

66. A structure as in claim 65 wherein said first and second diffused regions are N type and said current path is a P type region.

67. A structure as in claim 66 wherein said first and second metal-to-silicon contact areas each comprise a plurality of metal-to-silicon contacts and the area therebetween.

68. A protection structure as in claim 67 wherein said current path is segmented and said first and second diffused regions are interdigitated.

69. A structure as in claim 68 wherein said substantial part is at least one half.

70. A structure as in claim 69 wherein said many times at least 25.

71. A protection structure for a semiconductor device, comprising:
(a) a metal bonding pad at a face of a silicon chip;
(b) a first heavily doped region of a first conductivity type in said face of the silicon chip at the surface thereof;
(c) a second heavily doped region of a second conductivity type in said face of the silicon chip at the surface thereof, said second heavily doped region being spaced apart from said first heavily doped region;
(d) a current path formed between said first heavily doped region and said second heavily doped region in said face of the silicon chip at the surface thereof, for coupling said first heavily doped region to said second heavily doped region, said current path being many times wider than its length;
(e) a first metal-to-silicon contact area directly connected to said metal bonding pad without intervening resistor devices between said first metal-to-silicon contact area and said metal bonding pad, for coupling said metal bonding pad to said first heavily doped region, (f) said first metal-to-silicon contact area extending along the face parallel to the width dimension of said current path, for at least a substantial part of the width thereof, said first metal-to-silicon contact area being spaced from said current path by an amount at least twice the length of the current path; and (g) a second metal-to-silicon contact area connected to a voltage supply terminal of said chip, for coupling said voltage supply terminal to said second heavily doped region, said second metal-to-silicon contact area extending along the face parallel to the width dimension of said current path for at least a substantial part of the width thereof.

72. A protection structure as in claim 71 wherein said current path is a lightly doped region of said first conductivity type.

73. A protection structure as in claim 72 wherein said first conductivity type is N and said second conductivity type is P.

74. A protection structure as in claim 73 wherein said first and second metal-to-silicon contact areas each comprise a plurality of metal-to-silicon contacts and the area therebetween.

75. A protection structure as in claim 74 wherein said current path is segmented and said first and second heavily doped regions are interdigitated.

76. A protection structure as in claim 75 wherein said substantial part is at least one half.

77. A protection structure as in claim 76 wherein said many times is at least 25.

78. A protection structure as in claim 72 wherein said first conductivity type is P and said second conductivity type is N.

79. A protection structure as in claim 78 wherein said first and second metal-to-silicon contact areas each comprise a plurality of metal-to-silicon contacts and the area therebetween.

80. A protection structure as in claim 79 wherein said current path is segmented and said first and second heavily doped regions are interdigitated.

81. A protection structure as in claim 71 wherein said current path is a lightly doped region of said second conductivity type.

82. A protection structure as in claim 81 wherein said first conductivity type is N and said second conductivity type is P.

83. A protection structure as in claim 82 wherein said first and second metal-to-silicon contact areas each comprise a plurality of metal-to-silicon contacts and the area therebetween.

84. A protection structure as in claim 83 wherein said current path is segmented and said first and second heavily doped regions are interdigitated.

85. A protection structure as in claim 84 wherein said substantial part is at least one half.

86. A protection structure as in claim 85 wherein said many times is at least 25.

87. A protection structure as in claim 81 wherein said first conductivity type is P and said second conductivity type is N.

88. A protection structure as in claim 87 wherein said first and second metal-to-silicon contact areas each comprise a plurality of metal-to-silicon contacts and the area therebetween.

89. A protection structure as in claim 88 wherein said current path is segmented and said first and second heavily doped regions are interdigitated.

90. A protection structure as in claim 89 wherein said substantial part is at least one half.

91. A protection structure as in claim 90 wherein said many times is at least 25.

92. A structure for a semiconductor device, comprising:

(a) a metal bonding pad at a face of a silicon chip;

(b) a first heavily doped region of a first conductivity type in said face of the silicon chip at the surface thereof;

(c) a second heavily doped region of a second conductivity type in said face of the silicon chip at the surface thereof, said second heavily doped region being spaced apart from said first heavily doped region;

(d) a current path formed between said first heavily doped region and said second heavily doped region in said face of the silicon chip at the surface thereof, for coupling said first heavily doped region to said second heavily doped region, said current path being many times wider than its length;

(e) a first metal-to-silicon contact area directly connected to said metal bonding pad without intervening resistor devices between said first metal-to-silicon contact area and said metal bonding pad, for coupling said metal bonding pad to said first heavily doped region, (f) said first metal-to-silicon contact area extending along the face parallel to the width dimension of said current path, for at least a substantial part of the width thereof, said first metal-to-silicon contact area being spaced from said current path by an amount at least twice the length of the current path; and (g) a second metal-to-silicon contact area connected to a voltage supply terminal of said chip, for coupling said voltage supply terminal to said second heavily doped region, said second metal-to-silicon contact area extending along the face parallel to the width dimension of said current path for at least a substantial part of the width thereof.

93. A structure as in claim 92 wherein said current path is a lightly doped region of said first conductivity type.

94. A structure as in claim 93 wherein said first conductivity type is N and said second conductivity type is P.

95. A structure as in claim 94 wherein said first and second metal-to-silicon contact areas each comprise a plurality of metal-to-silicon contacts and the area therebetween.

96. A structure as in claim 95 wherein said current path is segmented and said first and second heavily doped regions are interdigitated.

97. A structure as in claim 96 wherein said substantial part is at least one half.

98. A structure as in claim 97 wherein said many times is at least 25.

99. A structure as in claim 93 wherein said first conductivity type is P and said second conductivity tye is N.

100. A structure as in claim 99 wherein said first and second metal-to-silicon contact areas each comprise a plurality of metal-to-silicon contacts and the area therebetween.

101. A structure as in claim 100 wherein said current path is segmented and said first and second heavily doped regions are interdigitated.

102. A structure as in claim 92 wherein said current path is a lightly doped region of said conductivity type.

103. A structure as in claim 102 wherein said first conductivity type is N and said second conductivity type is P.

104. A structure as in claim 103 wherein said first and second metal-to-silicon contact areas each comprise a plurality of metal-to-silicon contacts and the area therebetween.

105. A structure as in claim 104 wherein said current path is segmented and said first and second heavily doped regions are interdigitated.

106. A structure as in claim 105 wherein said substantial part is at least one half.

107. A structure as in claim 106 wherein said many times is at least 25.

108. A structure as in claim 102 wherein said first conductivity type is P and said second conductivity type is N.

109. A structure as in claim 108 wherein said first and second metal-to-silicon contact areas each comprise a plurality of metal-to-silicon contacts and the area therebetween.

110. A structure as in claim 109 wherein said current path is segmented and said first and second heavily doped regions are interdigitated.

111. A structure as in claim 110 wherein said substantial part is at least one half.

112. A structure as in claim 111 wherein said many times is at least 25.

* * * * *

REEXAMINATION CERTIFICATE (3419th)

United States Patent [19]

Rountree et al.

[11] B2 4,692,781

[45] Certificate Issued  Jan. 20, 1998

[54] SEMICONDUCTOR DEVICE WITH ELECTROSTATIC DISCHARGE PROTECTION

[75] Inventors: Robert N. Rountree, Richmond; Troy H. Herndon, Houston, both of Tex.

[73] Assignee: Texas Instruments Incorporated, Dallas, Tex.

Reexamination Request:
No. 90/004,484, Dec. 13, 1996

Reexamination Certificate for:
Patent No.: 4,692,781
Issued: Sep. 8, 1987
Appl. No.: 617,876
Filed: Jun. 6, 1984

Reexamination Certificate B1 4,692,781 issued May 30, 1995

[51] Int. Cl.$^6$ .............................. H01L 27/04; H01L 29/78
[52] U.S. Cl. ................................................ 257/360
[58] Field of Search ......................................... 257/360

[56] References Cited

U.S. PATENT DOCUMENTS

| | | | |
|---|---|---|---|
| 3,673,427 | 6/1972 | McCoy et al. | 307/202 |
| 3,999,213 | 12/1976 | Brandt et al. | 357/42 |
| 4,055,444 | 10/1977 | Rao | 148/1.5 |
| 4,288,829 | 9/1981 | Tango | 361/56 |
| 4,342,045 | 7/1982 | Kim | 357/41 |
| 4,509,067 | 4/1985 | Minami et al. | 357/13 |
| 4,514,646 | 4/1985 | Ando et al. | 307/200 B |
| 4,786,956 | 11/1988 | Puar | 357/23.13 |

FOREIGN PATENT DOCUMENTS

| | | | |
|---|---|---|---|
| 0139525 | 11/1978 | Japan . | |
| 0013780 | 2/1979 | Japan | 357/53 |
| 0037584 | 3/1979 | Japan | 357/53 |
| 0136278 | 10/1979 | Japan | 357/23.13 |
| 0061657 | 4/1983 | Japan | 357/23.13 |

OTHER PUBLICATIONS

Wong et al., *IEEE Journal of Solid-State Circuits*, "Special Correspondence—A 45 ns Fully Static 16K MOS ROM", vol. SC–16, No. 5, Oct. 1981, pp. 592–596.

Integrated Circuit Engineering Corporation, "MOS Frequency Divider Circuits (Organ Circuits) From Our Manufactures", Report #7044336–1, May 1970, pp. ii–6–1.

Dela Moneda, et al., "Layout For Lateral NPN Protective Device Enhancing Chip Wireability", *IBM Technical Disclosure Bulletin*, vol. 24, No. 7A, Dec. 1981, pp. 3427–3430.

Hulett, "On Chip Protection Of High Density NMOS Devices", *EOS/ESD Symp., Proc.* 90, 1981 (no month), pp. 90–96.

Greason, et al., "Analysis of ESD Damage In JFET Preamplifiers", *EOS/ESD Symp., Proc.* 67, 1980 (no month), pp. 67–72.

Carlson, et al., "Electrostatic Discharge Protective Device for Bipolar Circuits", *IBM Technical Disclosure Bulletin*, 179, vol. 21, No. 1, May 1978, pp. 179–180.

DeChairo, "Electro–Thermomigration in NMOS LSI Devices", *19th Annual Proc. Reliability Physics*, 223, 1981 (no month), pp. 223–229.

Turner et al., "Electrostatic Sensitivity of Various Input Protection Networks", *EOS/ESD Symp. Proc.*, 95, 1980 (no month) pp. 95–103.

(List continued on next page.)

*Primary Examiner*—James W. Davie

[57] ABSTRACT

An input protection circuit for an MOS device uses a thick-oxide transistor connected as a diode between a metal bonding pad and ground. The channel width of this transistor is chosen to be sufficient to withstand large, short-duration current spikes caused by electrostatic discharge. More important, the spacing between a metal-to-silicon contact to the drain of this transistor and the channel of the transistor (where heat is generated), is chosen to be much larger than usual so the metal of the contact will not be melted by heat propagating along the silicon surface during the current spike due to ESD. This spacing feature also applies to circuits for output pads, or circuits using diode protection devices.

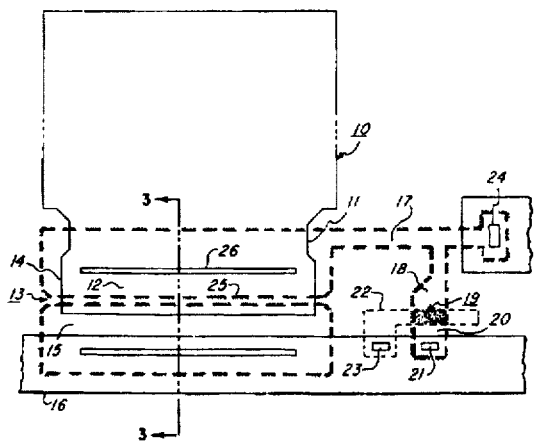

OTHER PUBLICATIONS

Taylor, "Input Protection Design for the 3 NMOS Process", *EOS/ESD Symp. Proc.* 97, 1980 (no month), pp. 97–100.

Hart et al., "LSI Design Considerations for ESD Protection Structures Related to Process and Layout Variations", *EOS/ESD Symp. Proc.* 87, 1980 (no month), pp. 87–94.

van Beek, "MOS/LSI Circuit Design: Designing–In Reliability", *10th Annual Proc. Reliability Physics,* 36, 1972 (no month), pp. 36–41.

Goel, A., "Procedure for Testing Electrostatic Discharge Susceptibility of MOS Devices", *19th Annual Proc. Reliability Physics,* 200, 1981 (no month), pp. 200–203.

Domingos, "Electro–Thermal Overstress Failure in Microelectonics", *Clarkson College of Technology,* Apr. 1973, pp. ii–181.

Foshiki, "64K RAM–Beginning to Take a Concrete Form", *Nikkei Electronics,* May 1978, pp. 50–64.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

THE DRAWING FIGURES HAVE BEEN CHANGED AS FOLLOWS:

FIG. 3 has been changed so that the distance A between the source-drain path and the contact area is at least about twice the length of the source-to-drain path.

AS A RESULT OF REEXAMINATION, IT HAS BEEN DETERMINED THAT:

The patentability of claims 1-3, 11, 12, 55-59 and 71-112 is confirmed.

Claim 10 was previously cancelled.

Claims 34-36 are cancelled.

Claims 4, 13-33, 37-54 and 60-70 are determined to be patentable as amended.

Claims 5-9, dependent on an amended claim, are determined to be patentable.

New claims 113-126 are added and determined to be patentable.

4. A [protection structure for a] semiconductor device *including a protection structure, the device* comprising:
 (a) a metal bonding pad at a face of a silicon chip;
 (b) *a plurality of transistors at the face of the silicon chip, each transistor including a source region, a drain region, and a gate region therebetween, each drain region having a third metal-to-silicon contact area spaced apart from the gate region by a design distance; and*
 (c) *a protection structure at the face of the silicon chip, the protection structure comprising:*
  [(b)] (*1*) a first N type diffused region in [said] *the* face of the silicon chip at the surface thereof;
  [(c)] (*2*) a second N type diffused region in [said] *the* face of the silicon chip at the surface thereof, [said] *the* second N type diffused region being spaced apart from [said] *the* first N type diffused region;
  [(d)] (*3*) a current path formed between [said] *the* first N type diffused region and [said] *the* second N type diffused region in [said] *the* face of the silicon chip at the surface thereof, *the current path* for coupling [said] *the* first N type diffused region to [said] *the* second N type diffused region, [said] *the* current path being many times wider than its length;
  [(e)] (*4*) a first metal-to-silicon contact area directly connected to [said] *the* metal bonding pad without intervening resistor devices between [said] *the* first metal-to-silicon contact area and [said] *the* metal bonding pad, *the first metal-to-silicon contact area* for coupling [said] *the* metal bonding pad to [said] *the* first N type diffused region, [(f)] *the first metal-to-silicon contact area including every contact at the surface coupling the metal bonding pad to the first N type diffused region,* [said] *the* first metal-to-silicon contact area extending along the face parallel to the width dimension of [said] *the* current path, for at least a substantial part of the width thereof, [said] *the* first metal-to-silicon contact area [being spaced from said current path by an amount] *having a minimum spacing from the current path that is substantially greater than the design distance and* at least twice the length of the current path; and
  [(g)] (*5*) a second metal-to-silicon contact area connected to a voltage supply terminal of [said] *the* chip, for coupling [said] *the* voltage supply terminal to [said] *the* second N type diffused region, [said] *the* second metal-to-silicon contact area extending along the face parallel to the width dimension of [said] *the* current path for at least a substantial part of the width thereof.

13. A [protection structure for a] semiconductor device *including a protection structure, the device* comprising:
 (a) a metal bonding pad at a face of a silicon chip;
 (b) *a plurality of transistors at the face of the silicon chip, each transistor including a source region, a drain region, and a gate region therebetween, each drain region having a third metal-to-silicon contact area spaced apart from the gate region by a design distance; and*
 (c) *a protection structure at the face of the silicon chip, the protection structure comprising:*
  [(b)] (*1*) a first N type diffused region in [said] *the* face of the silicon chip at the surface thereof;
  [(c)] (*2*) a second N type diffused region in [said] *the* face of the silicon chip at the surface thereof, [said] *the* second N type diffused region being spaced apart from [said] *the* first N type diffused region;
  [(d)] (*3*) a current path formed between [said] *the* first Ntype diffused region and [said] *the* second N type diffused region in [said] *the* face of the silicon chip at the surface thereof, *the current path* for coupling [said] *the* first N type diffused region to [said] *the* second N type diffused region, [said] *the* current path being many times wider than its length;
  [(e)] (*4*) a first metal-to-silicon contact area directly connected to [said] *the* metal bonding pad without intervening resistor devices between [said] *the* first metal-to-silicon contact area and [said] *the* metal bonding pad, *the first metal-to-silicon contact area* for coupling [said] *the* metal bonding pad to [said] *the* first N type diffused region, [(f) said] *the* first metal-to-silicon contact area extending along the face parallel to the width dimension of [said] *the* current path, for at least a substantial part of the width thereof, [said] *the* first metal-to-silicon contact area [being spaced from said current path by an amount] *having a minimum spacing from the current path that is substantially greater than the design distance and* at least about twice the length of the current path; and
  [(g)] (*5*) a second metal-to-silicon contact area connected to a voltage supply terminal of [said] *the* chip, for coupling [said] *the* voltage supply terminal to [said] *the* second N type diffused region, [said] *the* second metal-to-silicon contact area extending along the face parallel to the width dimension of [said] *the* current path for at least a substantial part of the width thereof.

14. A [protection structure] *semiconductor device* as in claim 13 wherein [said] *the* current path is a channel region of an MOS transistor.

15. A [protection structure] *semiconductor device* as in claim 14 wherein [said] *the* first and second metal-to-silicon contact areas each comprise a plurality of metal-to-silicon contacts and the area therebetween.

16. A [protection structure] *semiconductor device* as in claim 15 wherein [said] *the* channel region is segmented and [said] *the* first and second N type diffused regions are interdigitated drain and source regions.

17. A [protection structure] *semiconductor device* as in claim 16 wherein [said] *the* substantial part is at least one half.

18. A [protection structure] *semiconductor device* as in claim 17 wherein [said] *the* many times is at least 25.

19. A [protection structure] *semiconductor device* as in claim 13 wherein [said] *the* current path is a channel region of a thick oxide transistor.

20. A [protection structure] *semiconductor device* as in claim 19 wherein [said] *the* first and second metal-to-silicon contact areas each comprise a plurality of metal-to-silicon contacts and the area therebetween.

21. A [protection structure] *semiconductor device* as in claim 20 wherein [said] *the* substantial part is at least one half.

22. A [protection structure] *semiconductor device* as in claim 21 wherein [said] *the* many times is at least 25.

23. A [protection structure] *semiconductor device* as in claim 13 wherein [said] *the* current path is a P type region of an NPN transistor.

24. A [protection structure] *semiconductor device* as in claim 23 wherein [said] *the* first and second metal-to-silicon contact areas each comprise a plurality of metal-to-silicon contacts and the area therebetween.

25. A [protection structure] *semiconductor device* as in claim 24 wherein [said] *the* substantial part is at least one half.

26. A [protection structure] *semiconductor device* as in claim 25 wherein [said] *the* many times is at least 25.

27. A [structure for a] semiconductor device, comprising:
   (a) a metal bonding pad at a face of a silicon chip;
   (b) *a plurality of transistors at the face of the silicon chip, each transistor including a source region, a drain region, and a gate region therebetween, each drain region having a third metal-to-silicon contact area spaced apart from the gate region by a design distance; and*
   (c) *a structure at the face of the silicon chip, the structure comprising:*
      [(b)] (*1*) a first N type diffused region in [said] *the* face of the silicon chip at the surface thereof;
      [(c)] (2) a second N type diffused region in [said] *the* face of the silicon chip at the surface thereof, [said] *the* second N type diffused region being spaced apart from [said] *the* first N type diffused region;
      [(d)] (*3*) a current path formed between [said] *the* first N type diffused region and [said] *the* second N type diffused region in [said] *the* face of the silicon chip at the surface thereof, *the current path* for coupling [said] *the* first N type diffused region to [said] *the* second N type diffused region, [said] *the* current path being many times wider than its length;
      [(e)] (*4*) a first metal-to-silicon contact area directly connected to [said] *the* metal bonding pad without intervening resistor devices between [said] *the* first metal-to-silicon contact area and [said] *the* metal bonding pad, *the first metal-to-silicon contact area* for coupling [said] *the* metal bonding pad to [said] *the* first N type diffused region, [(f) said] *the* first metal-to-silicon contact area extending along the face parallel to the width dimension of [said] *the* current path, for at least a substantial part of the width thereof, [said] *the* first metal-to-silicon contact area [being spaced from said current path by an amount] *having a minimum spacing from the current path that is substantially greater than the design distance and* at least twice the length of the current path; and
      [(g)] (*5*) a second metal-to-silicon contact area connected to a voltage supply terminal of [said] *the* chip, for coupling [said] *the* voltage supply terminal to [said] *the* second N type diffused region, [said] *the* second metal-to-silicon contact area extending along the face parallel to the width dimension of [said] *the* current path for at least a substantial part of the width thereof.

28. A [structure] *semiconductor device* as in claim 27 wherein [said] *the* current path is a channel region of an MOS transistor.

29. A [structure] *semiconductor device* as in claim 28 wherein [said] *the* first and second metal-to-silicon contact areas each comprise a plurality of metal-to-silicon contacts and the area therebetween.

30. A [protection structure] *semiconductor device* as in claim 29 wherein [said] *the* channel region is segmented and [said] *the* first and second N type diffused regions are interdigitated drain and source regions.

31. A [structure] *semiconductor device* as in claim 30 wherein [said] *the* substantial part is at least one half.

32. A [structure] *semiconductor device* as in claim 31 wherein [said] *the* many times is at least 25.

33. A [structure] *semiconductor device* as in claim 26 wherein [said] *the* current path is a channel region of a thick oxide transistor.

37. A [structure] *semiconductor device* as in claim 27 wherein [said] *the* current path is a P type region of an NPN transistor.

38. A [structure] *semiconductor device* as in claim 37 wherein [said] *the* first and second metal-to-silicon contact areas each comprise a plurality of metal-to-silicon contacts and the area therebetween.

39. A [structure] *semiconductor device* as in claim 38 wherein [said] *the* substantial part is at least one half.

40. A [structure] *semiconductor device* as in claim 39 wherein [said] *the* many times is at least 25.

41. A [structure for a] semiconductor device, comprising:
   (a) a metal bonding pad at a face of a silicon chip;
   (b) *a plurality of transistors at the face of the silicon chip, each transistor including a source region, a drain region, and a gate region therebetween, each drain region having a third metal-to-silicon contact area spaced apart from the gate region by a design distance; and*
   (c) *a structure at the face of the silicon chip, the structure comprising:*
      [(b)] (*1*) a first N type diffused region in [said] *the* face of the silicon chip at the surface thereof;
      [(c)] (2) a second N type diffused region in [said] *the* face of the silicon chip at the surface thereof, [said] *the* second N type diffused region being spaced apart from [said] *the* first N type diffused region;
      [(d)] (*3*) a current path formed between [said] *the* first N type diffused region and [said] *the* second N type diffused region in [said] *the* face of the silicon chip at the surface thereof, *the current path* for coupling [said] *the* first N type diffused region to [said] *the* second N type diffused region, [said] *the* current path being many times wider than its length;

[(e)] *(4)* a first metal-to-silicon contact area directly connected to [said] *the* metal bonding pad without intervening resistor devices between [said] *the* first metal-to-silicon contact area and [said] *the* metal bonding pad, *the first metal-to-silicon contact area* for coupling [said] *the* metal bonding pad to [said] *the* first N type diffused region, [(f)] *the first metal-to-silicon contact area including every contact at the surface coupling the metal bonding pad to the first N type diffused region,* [said] *the* first metal-to-silicon contact area extending along the face parallel to the width dimension of [said] *the* current path, for at least a substantial part of the width thereof, [said] *the* first metal-to-silicon contact area [being spaced from said current path by an amount] *having a minimum spacing from the current path that is substantially greater than the design distance and* at least about twice the length of the current path; and

[(g)] *(5)* a second metal-to-silicon contact area connected to a voltage supply terminal of [said] *the* chip, for coupling [said] *the* voltage supply terminal to [said] *the* second N type diffused region, [said] *the* second metal-to-silicon contact area extending along the face parallel to the width dimension of [said] *the* current path for at least a substantial part of the width thereof.

42. A [structure] *semiconductor device* as in claim 41 wherein [said] *the* current path is a channel region of an MOS transistor.

43. A [structure] *semiconductor device* as in claim 42 wherein [said] *the* first and second metal-to-silicon contact areas each comprise a plurality of metal-to-silicon contacts and the area therebetween.

44. A [structure] *semiconductor device* as in claim 43 wherein [said] *the* channel region is segmented and [said] *the* first and second N type diffused regions are interdigitated drain and source regions.

45. A [structure] *semiconductor device* as in claim 44 wherein [said] *the* substantial part is at least one half.

46. A [structure] *semiconductor device* as in claim 45 wherein [said] *the* many times is at least 25.

47. A [structure] *semiconductor device* as in claim 41 wherein [said] *the* current path is a channel region of a thick oxide transistor.

48. A [structure] *semiconductor device* as in claim 47 wherein [said] *the* first and second metal-to-silicon contact areas each comprise a plurality of metal-to-silicon contacts and the area therebetween.

49. A [structure] *semiconductor device* as in claim 48 wherein [said] *the* substantial part is at least one half.

50. A [structure] *semiconductor device* as in claim 49 wherein [said] *the* many times is at least 25.

51. A [structure] *semiconductor device* as in claim 41 wherein [said] *the* current path is a P type region of an NPN transistor.

52. A [structure] *semiconductor device* as in claim 51 wherein [said] *the* first and second metal-to-silicon contact areas each comprise a plurality of metal-to-silicon contacts and the area therebetween.

53. A [structure] *semiconductor device* as in claim 52 wherein [said] *the* substantial part is at least one half.

54. A [structure] *semiconductor device* as in claim 53 wherein [said] *the* many times is at least 25.

60. A [protection structure for a] semiconductor device *including a protection circuit, the semiconductor device* comprising:

(a) a metal bonding pad at a face of a silicon chip[,]*;*

(b) *a plurality of transistors at the face of the silicon chip, each transistor including a source region, a drain region, and a gate region therebetween, each drain region having a drain contact area spaced apart from the gate region by a design distance; and*

(c) *a protection structure at the face of the silicon chip, comprising:*

[(b)] *(1)* a transistor having a source-to-drain path connecting [said] *the* metal [input] *bonding* pad to a voltage-supply conductor, having a polysilicon gate, having a source region connected to [said] *the* voltage-supply conductor, and having a drain region directly connected to [said] *the* metal bonding pad at an elongated contact area parallel to the width of [said] *the* source-to-drain path, *the elongated contact area including every contact connecting the drain region to the metal bonding pad,*

[(c)] *(2)* wherein [said] *the* source-to-drain path is many times wider than the length of [said] *the* source-to-drain path, and wherein the *minimum* spacing along [said] *the* face between [said] *the* source-to-drain path and [said] *the* elongated contact area is *substantially greater than the design distance and* at least about twice [said] *the* length of [said] *the* source-to-drain path.

61. A [protection structure] *semiconductor device* as in claim 60 wherein [said] *the* elongated contact area comprises a plurality of metal-to-silicon contacts and the area therebetween.

62. A [protection structure] *semiconductor device* as in claim 61 wherein [said] *the* source-to-drain path is segmented and [said] *the* source and drain regions are interdigitated.

63. A [protection structure] *semiconductor device* as in claim 62 wherein [said] *the* many times is at least 25.

64. A [protection structure] *semiconductor device* as in claim 63 wherein [said] *the* transistor is a thin oxide transistor.

65. A [protection structure for a] semiconductor device *including a protection circuit, the semiconductor device* comprising:

(a) a metal bonding pad at a face of a silicon chip;

(b) *a plurality of transistors at the face of the silicon chip, each transistor including a source region, a drain region, and a gate region therebetween, each drain region having a third metal-to-silicon contact area spaced apart from the gate region by a design distance; and*

(c) *a protection structure at the face of the silicon chip, the protection structure comprising:*

[(b)] *(1)* a first diffused region in [said] *the* face of the silicon chip at the surface thereof;

[(c)] *(2)* a second diffused region in [said] *the* face of the silicon chip at the surface thereof, [said] *the* second diffused region being spaced apart from [said] *the* first diffused region;

[(d)] *(3)* a current path, having no overlying gate, formed between [said] *the* first diffused region and [said] *the* second diffused region in [said] *the* face of the silicon chip at the surface thereof, *the current path* for coupling [said] *the* first diffused region to [said] *the* second diffused region, [said] *the* current path being many times wider than its length;

[(e)] *(4)* a first metal-to-silicon contact area directly connected to [said] *the* metal bonding pad without intervening resistor devices between [said] the first metal-to-silicon contact area and [said] the metal bonding pad, the first metal-to-silicon contact area for coupling [said] the metal bonding pad to [said] the first diffused region, [(f)] the first metal-to-silicon contact area including every contact at the surface coupling the metal bonding pad to the first diffused region, [said] the first metal-to-silicon contact area extending along the face parallel to the width dimension of [said] the current path, for at least a substantial part of the width thereof, [said] the first metal-to-silicon contact area [being spaced from said current path by an amount] having a minimum spacing from the current path that is substantially greater than the design distance and at least about twice the length of the current path; and

[(g)] (5) a second metal-to-silicon contact area connected to a voltage supply terminal of [said] the chip, for coupling [said] the voltage supply terminal to [said] the second diffused region, [said] the second metal-to-silicon contact area extending along the face parallel to the width dimension of [said] the current path for at least a substantial part of the width thereof.

66. A [structure] semiconductor device as in claim 65 wherein [said] the first and second diffused regions are N type and [said] the current path is a P type region.

67. A [structure] semiconductor device as in claim 66 wherein [said] the first and second metal-to-silicon contact areas each comprise a plurality of metal-to-silicon contacts and the area therebetween.

68. A [protection structure] semiconductor device as in claim 67 wherein [said] the current path is segmented and [said] the first and second diffused regions are interdigitated.

69. A [structure] semiconductor device as in claim 68 wherein [said] the substantial part is at least one half.

70. A [structure] semiconductor device as in claim 69 wherein [said] the many times is at least 25.

113. A semiconductor device as in claim 4, wherein the substantially greater is at least twice.

114. A semiconductor device as in claim 4, wherein the substantially greater is about two or three times.

115. A semiconductor device as in claim 13, wherein the substantially greater is at least about twice.

116. A semiconductor device as in claim 115, wherein the substantially greater is about two or three times.

117. A semiconductor device as in claim 116, wherein the first metal-to-silicon contact area includes every contact at the surface coupling the metal bonding pad to the first diffused region.

118. A semiconductor device as in claim 27, wherein the substantially greater is at least twice.

119. A semiconductor device as in claim 118, wherein the substantially greater is about two or three times.

120. A semiconductor device as in claim 119, wherein the first metal-to-silicon contact area includes every contact at the surface coupling the metal bonding pad to said first diffused region.

121. A semiconductor device as in claim 41, wherein the substantially greater is at least about twice.

122. A semiconductor device as in claim 121, wherein the substantially greater is about two or three times.

123. a semiconductor device as in claim 60, wherein the substantially greater is at least about twice.

124. A semiconductor device as in claim 123, wherein the substantially greater is about two or three times.

125. A semiconductor device as in claim 65, wherein the substantially greater is at least about twice.

126. A semiconductor device as in claim 125, wherein the substantially greater is about two or three times.

* * * * *